(12) United States Patent
Zhao et al.

(10) Patent No.: US 10,859,626 B2
(45) Date of Patent: Dec. 8, 2020

(54) RECEIVER EQUALIZATION AND STRESSED EYE TESTING SYSTEM

(71) Applicant: Futurewei Technologies, Inc., Plano, TX (US)

(72) Inventors: Gang Zhao, Chandler, AZ (US); Yongyao Li, Chengdu (CN); Xusheng Liu, Shenzhen (CN)

(73) Assignee: Futurewei Technologies, Inc., Plano, TX (US)

( * ) Notice: Subject to any disclaimer, the term of this patent is extended or adjusted under 35 U.S.C. 154(b) by 75 days.

(21) Appl. No.: 16/039,945

(22) Filed: Jul. 19, 2018

(65) Prior Publication Data

US 2020/0025824 A1    Jan. 23, 2020

(51) Int. Cl.
*G01R 31/28* (2006.01)
*G01R 31/317* (2006.01)
(Continued)

(52) U.S. Cl.
CPC ..... *G01R 31/3171* (2013.01); *G01R 31/3191* (2013.01); *G11C 29/56004* (2013.01); *G11C 29/56008* (2013.01); *G11C 29/56012* (2013.01); *G11C 29/56016* (2013.01); *H04L 1/203* (2013.01); *G11C 2029/5602* (2013.01); *G11C 2029/5604* (2013.01)

(58) Field of Classification Search
CPC ............ G01R 31/3171; G01R 31/3191; G11C 29/56004; G11C 29/56008
See application file for complete search history.

(56) References Cited

U.S. PATENT DOCUMENTS 7,471,220 B2 * 12/2008 Mattes ............. G01R 31/31716
341/120
8,347,153 B2 * 1/2013 Krepner .................. H04L 43/50
714/704

(Continued)

OTHER PUBLICATIONS

"JEDEC Standard, DDR4 SDRAM, JESD79-4A", (Revision of JESD79-4, Sep. 2012), (2012), 218 pgs.

(Continued)

*Primary Examiner* — Esaw T Abraham
(74) *Attorney, Agent, or Firm* — Schwegman Lundberg & Woessner, P.A.

(57) ABSTRACT

A method of conducting bit error rate testing of an electronic device under test using a bit error rate tester (BERT) includes configuring the BERT with one or more of jitter, noise, and timing settings to derive a desired receiver stressed eye diagram; connecting the electronic device under test to the BERT via an inter-symbol interference channel that introduces delays for creation of the desired receiver stressed eye diagram at the electronic device under test; the BERT placing the electronic device under test into a loopback mode whereby data transmitted to the electronic device under test by the BERT is transmitted back to the BERT for comparison to the data transmitted to the electronic device under test; the BERT transmitting a data pattern into the electronic device under test; and the BERT comparing the data pattern transmitted to the electronic device under test by the BERT to data received back from the electronic device under test during the loopback mode to detect a bit error rate.

20 Claims, 9 Drawing Sheets

(51) Int. Cl.
*G01R 31/319* (2006.01)
*H04L 1/20* (2006.01)
*G11C 29/56* (2006.01)

(56) References Cited

U.S. PATENT DOCUMENTS

| | | | | |
|---|---|---|---|---|
| 8,793,541 B2* | 7/2014 | Hsu | ............... | G06F 11/2733 714/704 |
| 9,025,693 B2* | 5/2015 | Wang | ............... | H04B 17/14 375/221 |
| 9,672,089 B2* | 6/2017 | Poulo | ............... | G01R 13/029 |
| 2004/0125874 A1* | 7/2004 | Baumert | ............ | H04B 10/2569 375/226 |
| 2006/0018374 A1* | 1/2006 | Nelson | ............ | H04L 1/205 375/227 |
| 2006/0109896 A1* | 5/2006 | Steinbach | ........ | G01R 31/1709 375/226 |
| 2007/0121759 A1* | 5/2007 | Sonntag | ............. | H04L 27/0002 375/316 |
| 2007/0156360 A1* | 7/2007 | Romero | ............. | G01R 13/0236 702/69 |
| 2007/0274378 A1* | 11/2007 | Warke | ................... | H04B 17/26 375/225 |

OTHER PUBLICATIONS

"Loopback Presentation", JEDEC(r) Global Standards for the Microelectronics Industry, (Aug. 2017), 4 pgs.

"Proposed DDR5 Rx Stressed Eye Specification REV2", Committee Letter Ballot, Committee: JC42.3C, Committee Item No. 1849.18, (c) JEDEC 2011, (2011), 4 pgs.

"Proposed DDR5 SDRAM Loopback Pin Specification", Committee Letter Ballot, Committee: JC42.3B5, Committee Item No. 1830.92A, (c) JEDEC 2011, (2011), 3 pgs.

\* cited by examiner

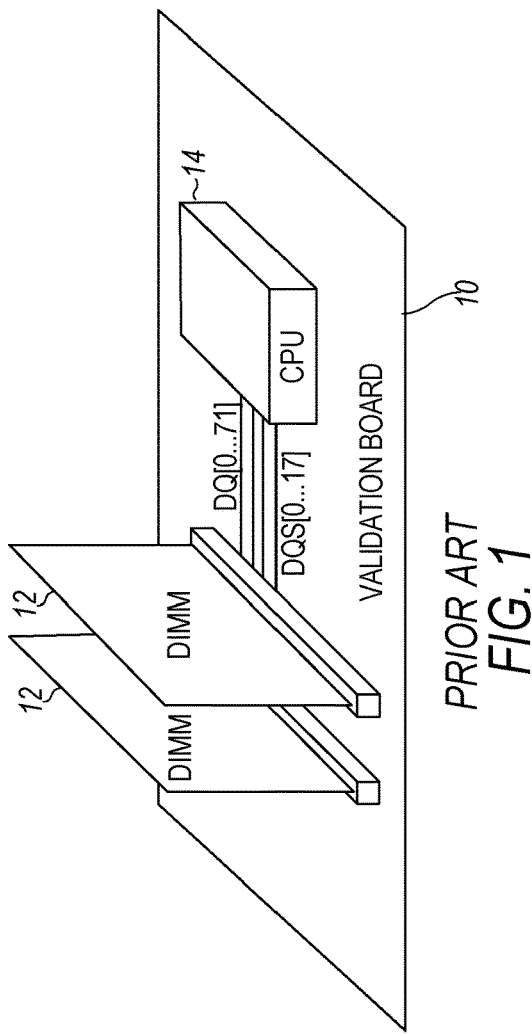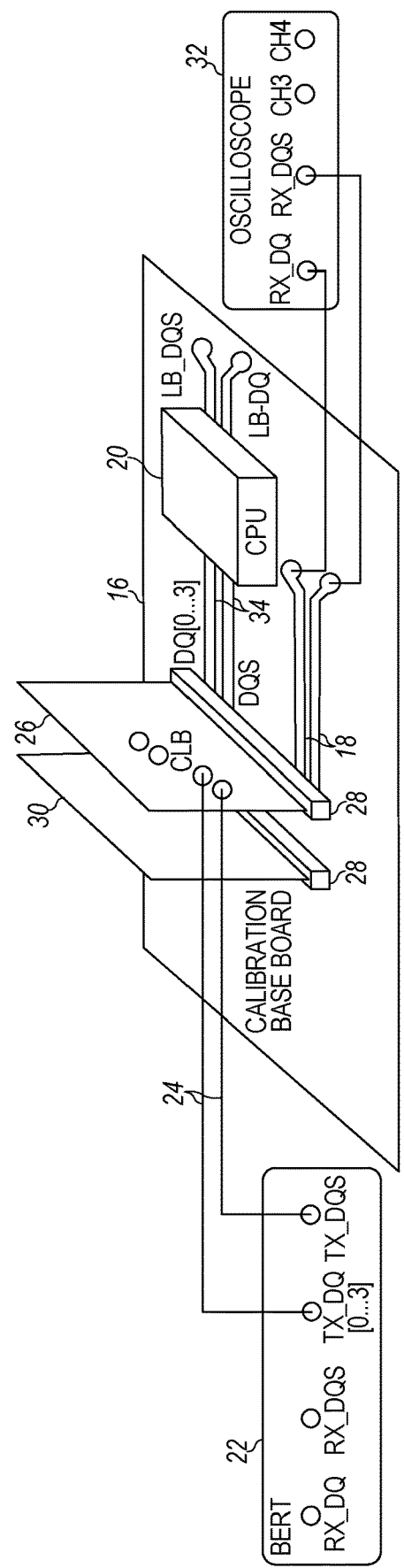

(CALIBRATION)

*(TESTING)*

RECEIVER EQUALIZATION AND STRESSED EYE TESTING SYSTEM

CROSS-REFERENCE TO RELATED APPLICATIONS

The present application is related to U.S. Provisional Patent Application No. 62/633,421, filed Feb. 21, 2018, entitled "A Receiver Equalization and Stressed Eye Testing Methodology for DDR5 Memory Controller" and assigned to the present Assignee. The contents of that application are incorporated herein by reference.

BACKGROUND

The rapid growth in data center, cloud computing and artificial intelligence applications have spurred increasing demand for memory bandwidth and double data rate (DDR) interface speed in recent years. In 2018, the first generation of commercial double data rate type six synchronous graphics random-access memory (GDDR6) devices for computer based systems are being rolled out that increase the speed of memory devices to 10~14 Gb/s from 8 Gb/s. The JEDEC Solid State Technology Association fifth generation double data rate synchronous dynamic random-access memory (DDR5 SDRAM) specification for mainstream computation applications due to publish in the middle of 2018 is further expected to double the fourth-generation double data rate synchronous dynamic random-access memory (DDR4 SDRAM) speed to a new height of 6.4 Gb/s.

In support of the continuing increase of the DDR interface speed while still enabling a set of complex bus topologies, more and more transceiver equalization techniques that were traditionally designed for the high-speed serializer/deserializer (SerDes) interfaces were recently introduced to the parallel interface of the DDR5 SDRAM. These new features include the decision feedback equalization (DFB), the continuous time linear equalization (CTLE), and the feed forward equalization (FFE). A similar adoption of transceiver equalization techniques is expected on the controller side.

With the transceiver design technology of DDR5 SDRAM devices merging towards the aforementioned SerDes techniques, new testing methodologies are desired for DDR5 system board and memory controller devices that were traditionally used for SerDes interface devices, such as the receiver link equalization and stressed eye test. There is an urgent need to provide such testing systems and associated methods in anticipation of new DDR5 controller chips and SDRAM devices being provided to the market.

SUMMARY

Various examples are now described to introduce a selection of concepts in a simplified form that are further described below in the Detailed Description. The Summary is not intended to identify key or essential features of the claimed subject matter, nor is it intended to be used to limit the scope of the claimed subject matter.

According to one aspect of the present disclosure, a system is provided for conducting receiver link equalization and bit error rate (BER) testing for an electronic device using a bit error rate tester (BERT). The system includes an electrical validation board having one or more pairs of data traces adapted to connect to an electronic device under test and a calibration load board adapted to connect to the one or more pairs of data traces of the electrical validation board to receive a data pattern with jitter and noise injected from the BERT for transmission to the electronic device under test and to transmit the data pattern back to the BERT for calculation of a bit error rate.

Optionally, in any of the preceding aspects, the one or more pairs of data traces comprises two or more pairs of data traces where each pair of data traces has a different length to cause different delay and inter-symbol interference effects when a data pattern is provided to the electronic device under test via one of the pairs of data traces.

Optionally, in any of the preceding aspects, wherein the electrical validation board includes a clock bus and a command and address (CA) bus, and wherein a loopback function is provided by connecting an output of the electronic device under test to the clock bus and the CA bus of the electrical validation board, whereby the data pattern received by the electronic device under test is sent back through CA and clock ports of the device under test and transmitted through the CA bus and clock bus of the electrical validation board and compliance load board back to the BERT.

Optionally, in any of the preceding aspects, wherein the electrical validation board includes one or more of Command, Control, Data, Response and other output buses, and wherein a loopback function is provided by connecting an output of the electronic device under test to one or more of Command, Control, Data, Response and other output buses of the electrical validation board, whereby the data pattern received by the device under test is sent back through one or more of Command, Control, Data, Response and other output ports of the device under test and transmitted through one or more of the Command, Control, Data, Response and other output buses of the electrical validation board and compliance load board back to the BERT.

Optionally, in any of the preceding aspects, wherein the one or more pairs of data traces of the electrical validation board are of equal length, further comprising an inter-symbol interference board disposed between the BERT and the calibration load board so as to receive the data pattern from the BERT, the inter-symbol interference board having respective pairs of data traces of varied lengths to provide the different delay and inter-symbol interference effects to the electronic device under test via the calibration load board.

Optionally, in any of the preceding aspects, a loopback function is provided by outputting the received data pattern through signal ports of the device under test and transmitting the outputted signals back to the BERT through the buses of the electrical validation board, the compliance load board and the inter-symbol interference board.

According to another aspect of the present disclosure, a method of conducting bit error rate testing of an electronic device under test using a bit error rate tester (BERT) is provided comprising: configuring the BERT with one or more of jitter, noise, and timing settings to derive a desired receiver stressed eye diagram; connecting the electronic device under test to the BERT via an inter-symbol interference channel that introduces delays for creation of the desired receiver stressed eye diagram at the electronic device under test; the BERT placing the electronic device under test into a loopback mode whereby data transmitted to the electronic device under test by the BERT is transmitted back to the BERT for comparison to the data transmitted to the electronic device under test; the BERT transmitting a data pattern into the electronic device under test; and the BERT comparing the data pattern transmitted to the electronic device under test by the BERT to data received back from the electronic device under test during the loopback mode to detect a bit error rate.

Optionally, in any of the preceding aspects, configuring the BERT comprises configuring the BERT to run an equalization protocol to train the electronic device under test to obtain one or more of an optimal decision feedback equalization tap setting and an optimal continuous time linear equalization tap setting for the inter-symbol interference channel.

Optionally, in any of the preceding aspects, the method includes the further step of selecting a data trace from a number of data traces of an electrical validation board into which the electronic device under test is connected for testing, the data traces having different lengths, the selected data trace forming part of the inter-symbol interference channel to introduce a desired delay for creation of the desired receiver stressed eye diagram at the electronic device under test.

Optionally, in any of the preceding aspects, the loopback mode comprises transmitting the data pattern to the electronic device under test from the BERT via the selected data trace of the electrical validation board and the electronic device under test transmitting the received data pattern back to the BERT via the selected data trace of the electrical validation board.

Optionally, in any of the preceding aspects, the method includes the further step of selecting a data trace from a number of data traces of an inter-symbol interference board disposed between the BERT and the electronic device under test, the data traces having different lengths, the selected data trace forming part of the inter-symbol interference channel to introduce a desired delay for creation of the desired receiver stressed eye diagram at the electronic device under test.

Optionally, in any of the preceding aspects, the loopback mode comprises transmitting the data pattern to the electronic device under test from the BERT via the selected data trace of the inter-symbol interference board and the electronic device under test transmitting the received data pattern back to the BERT via the selected data trace of the inter-symbol interference board.

Optionally, in any of the preceding aspects, the data pattern provided to the electronic device under test causes the generation of stressed eye signals at the electronic device under test.

According to yet another aspect of the present disclosure, a system is provided for calibrating a receiver stressed eye signal using a bit error rate tester (BERT). The system includes a calibration base board having data traces and data strobe traces; a calibration load board adapted to connect to the data traces and data strobe traces of the calibration base board to receive a data pattern with jitter and noise injected from the BERT; and an oscilloscope connected to the data traces and data strobe traces of the calibration base board to display the stressed eye signal received from the BERT, wherein the data pattern is provided to the oscilloscope over data traces having varied lengths to provide different delay and inter-symbol interference effects for display by the oscilloscope.

Optionally, in any of the preceding aspects, the data traces and data strobe traces of the calibration base board have varied lengths.

Optionally, in any of the preceding aspects, the data traces and data strobe traces of the calibration base board are of equal length, further comprising an inter-symbol interference board disposed between the BERT and the calibration load board which receives the data pattern from the BERT, the inter-symbol interference board having data traces of varied lengths to provide the different delay and inter-symbol interference effects to the oscilloscope via the calibration load board and calibration base board.

Optionally, in any of the preceding aspects, the data pattern provided to the electronic device under test causes the generation of stressed eye signals for display on the oscilloscope.

Optionally, in any of the preceding aspects, the oscilloscope steps through receiver continuous time linear equalization settings to obtain an optimal transmitter preset.

Optionally, in any of the preceding aspects, an input of the oscilloscope is directly connected to a transmit channel of the BERT so as to receive random jitter and sinusoidal jitter levels of transmit signals from the BERT set to nominal values described in prescribed design specifications for the electronic device under test.

Any one of the foregoing examples may be combined with any one or more of the other foregoing examples to create a new embodiment within the scope of the present disclosure.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

FIG. 1 illustrates a perspective view of a conventional electrical validation board (EVB) for the electrical testing of the fourth-generation double data rate (DDR4) dual in-line memory module (DIMM)/dynamic random-access memory (DRAM) interface.

FIG. 2 illustrates a perspective view of a CPU receiver equalization testing arrangement set up for calibration as described in U.S. Provisional Patent Application No. 62/633,421.

DETAILED DESCRIPTION

Figure 3:
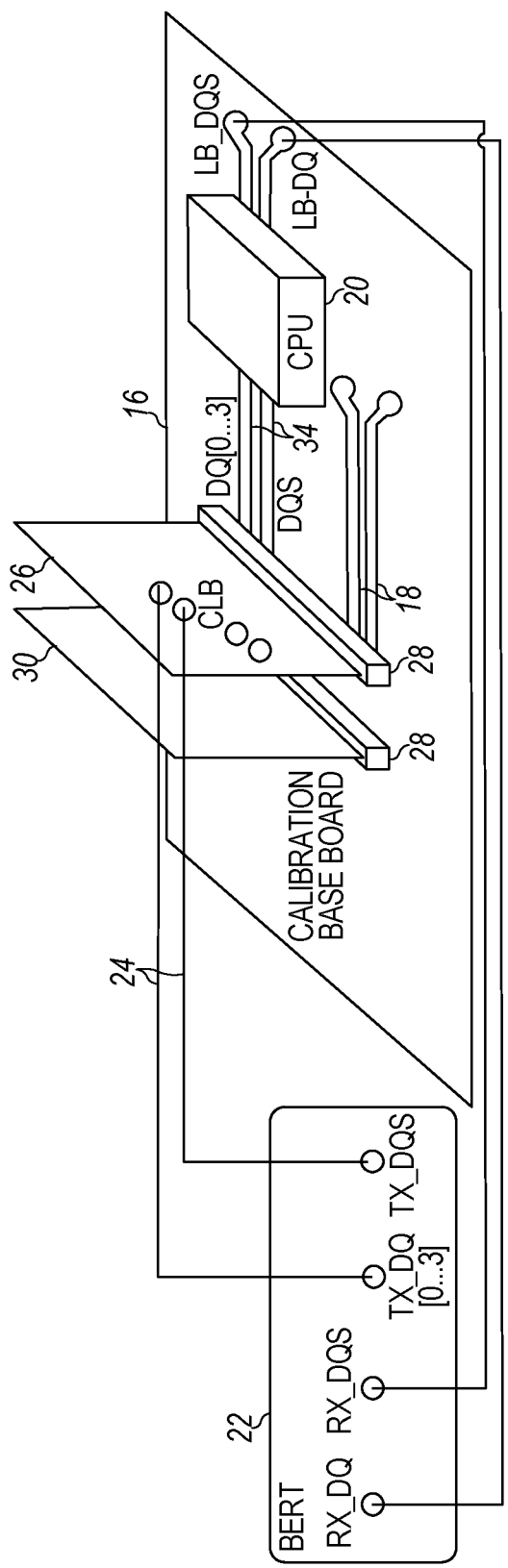
FIG. 3 illustrates a perspective view of a CPU receiver equalization testing arrangement set up for Bit Error Rate (BER) testing.

It should be understood at the outset that although an illustrative implementation of one or more embodiments are provided below, the disclosed systems and/or methods described with respect to FIGS. 1-11 may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

As shown in FIG. 1, conventional electrical testing for the fourth-generation double data rate (DDR4) dual in-line memory module (DIMM)/dynamic random-access memory (DRAM) interface 12 is often performed by an electrical validation board (EVB) 10. The bus topology of the EVB 10 is very similar to the customer reference board (CRB) in that it maintains similar trace lengths of the double data rate (DDR) bus and loading conditions with 2 DIMMs per channel.

The most widely adopted electrical testing method of the DDR4 DIMM/DRAM interface is the Rank Margining Test (RMT), which has been a proprietary methodology for the X86 server and PC (personal computer) systems. This test focuses on obtaining the boundary of the receiver stressed eye diagrams of the data signals. As known to those skilled in the art, a stressed eye diagram is an oscilloscope display in which a digital signal from a receiver is repetitively sampled and applied to the vertical input while the data rate is used to trigger the horizontal sweep. A stressed eye diagram is a tool for the evaluation of the combined effects of channel noise and inter-symbol interference on the performance of the system. The CPU 14 sweeps the voltage reference level (VREF) up and down to retrieve the eye height of the data, and sweeps the data signal in the time-domain by incrementing the delay line to get its eye width. Each X86 CPU vendor publishes a margin guideline of data eye width and eye height. The testing results that meet the eye width and height requirements are considered pass with low risk.

Although RMT testing has been very popular among system developers to quickly evaluate the DDR4 interface performance and risk, it faces inherent limitations to be further extended to fifth-generation double data rate (DDR5) electrical testing. First, it does not support bit error rate (BER) testing, which is becoming the new foundation of electrical testing for the DDR5 DRAM as being ratified by the JEDEC Solid State Technology Association. As noted above, BER testing has traditionally been a SerDes testing methodology, but BER testing is being introduced to the DDR5 specification due to the higher speed requirement. Second, the RMT testing benchmarks of the CPU receiver stressed eye depend heavily on many variables, including the DRAM silicon process corner, the DIMM manufacture corners and the mother board manufacture corners. As a result, the testing result varies significantly among individual systems and is not capable of providing a receiver stressed eye to reveal the CPU's inherent tolerance and capacity to timing and voltage stress, nor can it be used to test or validate the design target or design specifications. As will be explained below, both of these limitations are addressed and resolved by the testing systems and methods described herein.

To address the limitations of the traditional RMT testing system, the present application describes multiple testing embodiments. One example testing setup is described with respect to FIG. 2 and FIG. 3. Although this methodology can well serve the purpose of DDR5 receiver equalization, stressed eye and BER testing, it uses a customized calibration base board (CBB) 16 with a replica channel trace 18 for each individual CPU chip set (20). The calibration base board 16 is different than the existing hardware of the electrical validation board (EVB) and the customer reference board (CRB), and a dedicated calibration base board 16 is needed for every CPU chip 20 for which compliance tests are to be conducted. In contrast, the testing method described below utilizes existing testing devices including the EVB without incurring new hardware and engineering costs.

In the calibration and testing setups of FIG. 2 and FIG. 3, a bit error rate tester (BERT) 22 is used as a signal generator to drive and transmit DDR5 signals into a SubMiniature Version A (SMA) cable 24, which is connected to a calibration load board (CLB) 26. The transmit (TX) channel of the BERT 22 includes a minimum of one differential pair of TX_DQS (data strobe) signals, and four single-ended TX_DQ[0 . . . 3] data signals. The BERT 22 also has receive channels including the RX_DQ and RX_DQS signals in order to support loopback testing. The CLB 26 has the same pin-out as a standard DDR5 RDIMM, and is inserted into DDR5 RDIMM connector sockets 28 on the CBB 16. A DDR5 DIMM card or dummy DIMM card 30 is inserted into a non-driving DIMM slot 28 to provide necessary termination and signal distortion to the transmit signals from the BERT 22.

For the calibration step using the setup of FIG. 2, the TX_DQ and TX_DQS signal buses are connected to the replica channel on the CBB 16, which are then connected to the inputs of an oscilloscope 32 for waveform processing and display. To ensure the same signal integrity and crosstalk effect between the calibration step and the BER testing step, the replica channel traces 18 are laid out identically to a double data rate (DDR) buses 34 connected from the DIMM connector 28 to the CPU 20.

FIG. 3 illustrates an embodiment as described in U.S. Provisional Patent Application No. 62/633,421 where loopback signals LB_DQ and LB_DQS are provided to the RX_DQ and RX_DQS channel ports of the BERT 22. It will be appreciated that this approach slightly increases the cost of the CPU chipset 20 as two additional pins are needed per channel, which would necessitate 16 additional pins for an 8-channel CPU. The electrical testing system and method described herein for testing a DDR5 memory controller uses a set of reusable compliance testing hardware that can be plugged into an existing EVB without the need for new loopback DQ (LB_DQ) and loopback DQS (LB_DQS) signals.

In sample embodiments, an electrical testing system and method for DDR5 system board and memory controller receiver equalization is provided and the detailed testing flow is defined. A two-step approach includes a step of calibration and a step of bit error rate (BER) testing. In comparison with prior testing systems and methods such as those described above with respect to FIGS. 1-3, the system and method described herein does not require a dedicated calibration base board (CBB) with replica channels. In addition, the system and method described herein saves CPU pins by providing an option to loopback the signals through existing command and address (CA), Clock buses, and other buses including Command, Control, Data, Response, and other output pins to the calibration base board. Also, an inter-symbol interference (ISI) board provides additional signal degradation to facilitate the receiver equalization test.

In sample embodiments, the electrical testing system utilizes standard sets of a calibration load board (CLB) and a CBB without a customized replica channel for the calibration of the stressed eye, and then uses the existing electrical validation board (EVB) for the CPU to conduct the BER testing. Therefore, no new hardware is needed. Also, an option is provided to use the existing CA and Clock signals (and alternatively the Command, Control, Data, Response, and other output pins) to loop back the received data signals, thereby eliminating the need for new loopback signals, LB_DQ and LB_DQS. Also, an option to use inter-symbol interference (ISI) channels with various lengths is provided to increase the flexibility for providing various levels of signal degradation for the receiver equalization test.

Figure 4:
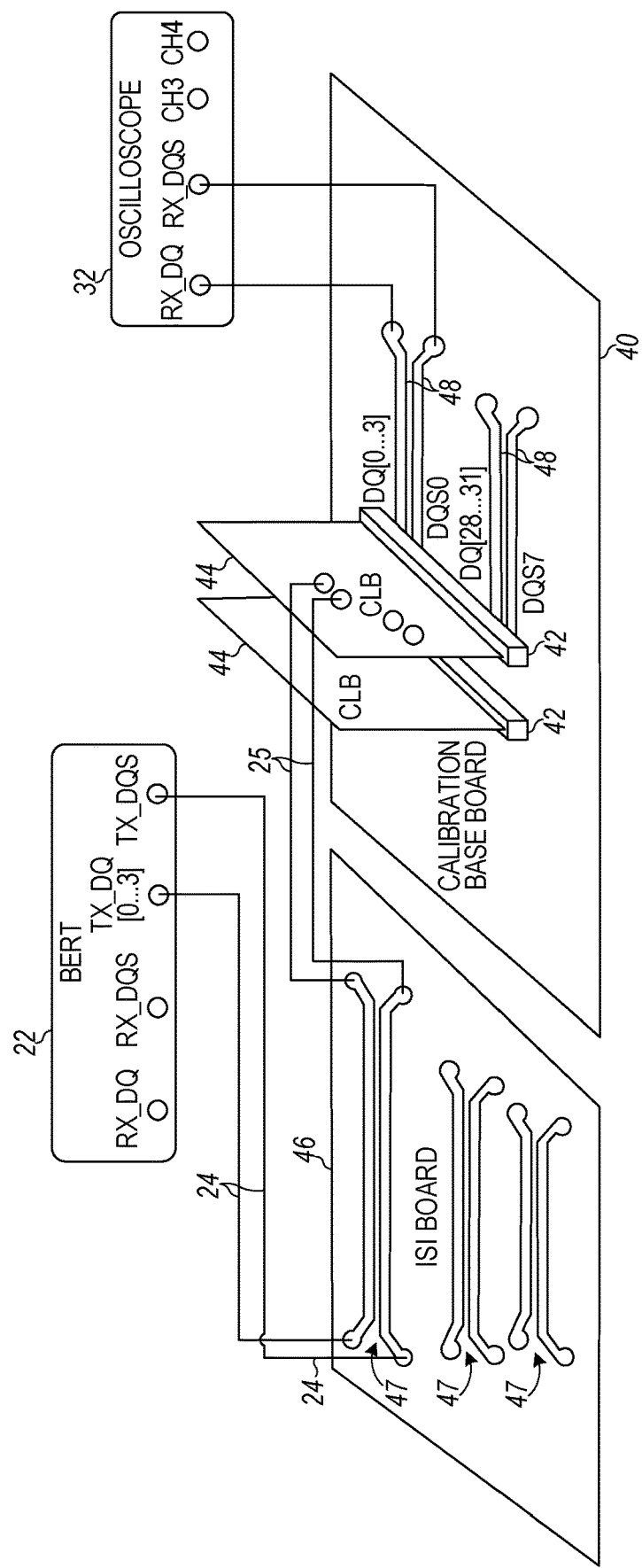
FIG. 4 illustrates a perspective view of a receiver equalization testing arrangement set up for calibrating a fifth-generation double data rate (DDR5) system board and memory controller in a sample embodiment.

The receiver equalization testing methodology for a DDR5 system board and memory controller includes two steps, a calibration step and a BER testing step. The setup for the calibration step is demonstrated in FIG. 4. As illustrated in FIG. 4, the calibration setup includes a Calibration Base Board (CBB) 40, which is a mother board with one or more DIMM sockets 42 that connect to testing equipment. It is noted that the CBB 40 is not the same as the Calibration Base Board 16 of the embodiment of FIG. 2 and FIG. 3 as, for example, no replica channel is provided and the CBB 40 may be used for different products to be tested, without modification. A Calibration Load Board (CLB) 44, which is a testing card with similar form factor to a DDR5 DIMM, is inserted into a DIMM socket 42 of the CBB 40. An inter-symbol interference (ISI) board 46 is also provided. The ISI board 46 has various trace lengths 47 for DQ and DQS in order to create means for providing different delay and inter-symbol interference (ISI) effects. The ISI Board 46 connects the CLB 44 to the BERT 22, which is a high-capacity high-speed tester that generates a stressed eye signal with controlled error and noise and receives the looped back signal for BER measurement. A high-speed real-time oscilloscope 32 with built-in S-parameter embedding and de-embedding features and equalization features for DDR5 is connected to the DQ bus 48 on the CBB 40 as illustrated.

The BERT 22 is used as the signal generator to drive and transmit DDR5 DQ and DQS signals into the SMA cable 24, which is connected through the ISI board 46 and SMA cable 25 to the CLB 44. The transmit (TX) channel of the BERT 22 includes a minimum of one differential pair of TX_DQS signals, and four single-ended TX_DQ[0 . . . 3] signals. This will be sufficient to test the x4 DDR5 interface including a crosstalk effect. Optionally, the TX channel of the BERT 22 can be expanded to 8 single-ended signals including TX_DQ[0 . . . 7], plus the differential TX_DQS signals, in order to provide full testing capability for the x8 DDR5 interface. The BERT 22 also has receive channels including the RX_DQ and RX_DQS signals in order to support the loopback testing, as will be described below.

The ISI board 46 has a wide range of trace lengths 47 for DQ and DQS to create various delay, loss and inter-symbol interference effects for the DQ and DQS signals. The CLB 44 has the same pin-out as the standard DDR5 RDIMM, and is inserted into the DDR5 RDIMM connector socket 41 on the CBB 40. Another CLB 44, or a dummy DIMM card is inserted into a non-driving DIMM socket 42, to provide any necessary termination and signal distortion to the transmit signals from the BERT 22. The testing and calibration should cover both cases where the CLB 44 is placed in the DIMM socket 41 near the oscilloscope 32 and the DIMM socket 42 far from the oscilloscope 32 (see FIG. 4). For the testing of one DIMM per channel, the DIMM socket 41 is unpopulated and the CLB 44 is inserted into the DIMM socket 42.

For the calibration step, the CLB 44 is inserted into the CBB 40, which is connected to the inputs of oscilloscope 32 through DQ bus 48 for waveform processing and display. The oscilloscope 32 has embedded S-parameter models to embed and to reproduce the insertion loss and crosstalk degradation from the EVB traces, the CPU package, and a reference receiver equalization model including decision feedback equalization (DFE) and continuous time linear equalization (CTLE) to simulate the recovered signal stressed eye seen at internal latches of the CPU 20. In addition, the oscilloscope 32 also has the ability to de-embed the insertion loss effect of the traces 48 of the CBB 40.

The calibration procedure is outlined in the following steps:

1. Connect the TX channels of the BERT 22 directly to the input of the oscilloscope 32 through SMA cables 24. The BERT 22 then transmits DDR5 compliance TX_DQ and TX_DQS signals to the oscilloscope 32. The random jitter and sinusoidal jitter levels of the TX signals are set to the nominal root mean square (RMS) jitter specifications as defined in DDR5 DRAM specifications.

2. Calibrate the timing relationship between TX_DQ and TX_DQS from the BERT 22 to reach the worst-case timing specifications as defined by tDQSQ and tQHS parameters in the DDR5 DRAM specifications. Note that calibration steps 1 and 2 should directly connect the output of the BERT 22 to the input of the oscilloscope 32 without going through the testing fixtures.

3. Connect the BERT 22 and the oscilloscope 32 with the ISI board 46, CLB 44, and CBB 40 as shown in FIG. 4. The BERT 22 then injects noise to the differential DQS and single-ended DQ signals to the nominal noise levels specified by DDR5 DRAM specifications.

4. Step through the various ISI channels 47 by selectively connecting the SMA cables 24 to the respective ISI traces 47 and selecting the worst-case ISI channel including ISI traces 47 that can still meet the receiver (RX) stressed eye mask specification as defined by the memory controller's design target.

5. For the selected ISI calibration channel, step through the TX de-emphasis preset settings of the BERT 22 and the RX CTLE settings of the oscilloscope 32 to obtain the optimal TX preset an RX CTLE combinations. Record the settings for the BER testing.

6. If the eye width and height of the obtained stress eye signal is still greater than the stressed eye mask specified by the memory controller design target, make a final adjustment on sinusoidal jitter, voltage noise and signal swing levels to reduce the eye width and height at the receiver of oscilloscope 32 to reach the closest possible levels to the design target. Record the BERT settings for the next BER testing step.

Figure 5:
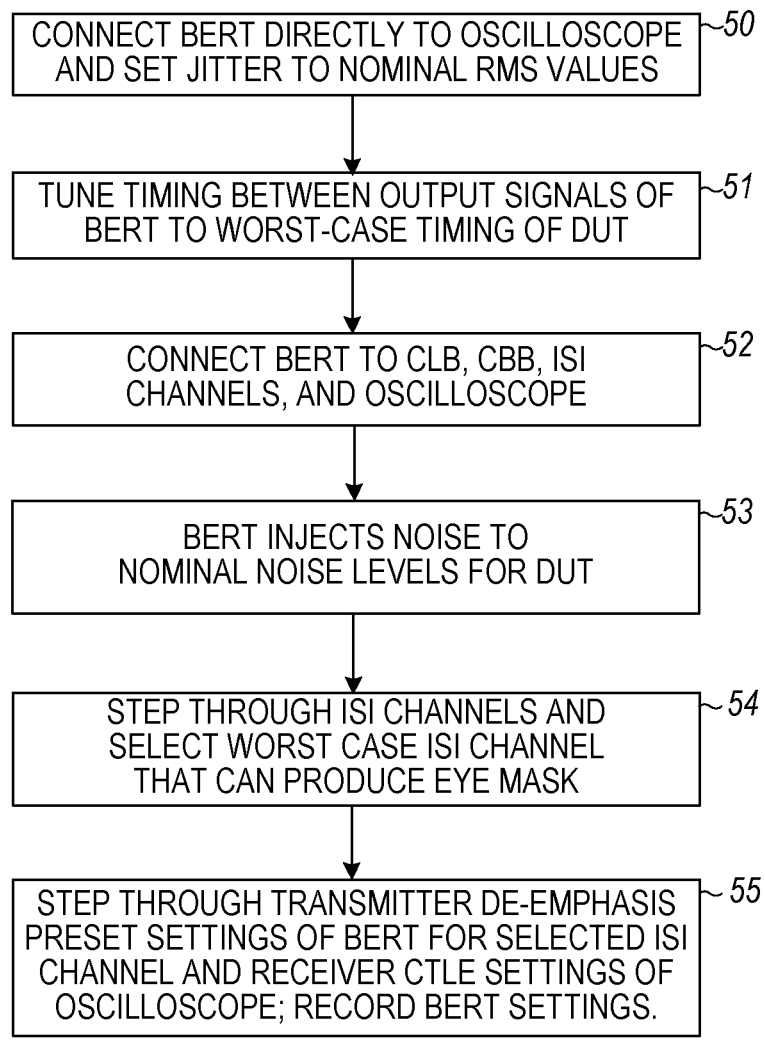
FIG. 5 illustrates the calibration method of a sample embodiment.

FIG. 5 illustrates the calibration method of a sample embodiment. As illustrated, the calibration method includes connecting a transmit channel of the BERT 22 directly to an input of the oscilloscope 32 through SMA cables 24 and setting random jitter and sinusoidal jitter levels of transmit signals from the BERT 22 to nominal RMS values at step 50.

A timing relationship between output transmit signals of the BERT 22 is tuned to worst-case timing specifications for the device under test (e.g. CPU 20) at step 51. The BERT 22 is connected to CLB 44 that is connected to DQ bus 48 of the CBB 44 and ISI channels, and the DQ bus 48 of the CBB 44 are connected to the oscilloscope 32 at step 52. The BERT 22 injects noise to nominal noise levels for differential DQS signals and DQ signals for the device under test at step 53 and then steps through various ISI channels and selects a worst-case ISI channel that can produce a stressed eye mask specification for the device under test at step 54. For the selected ISI channel, the calibration method concludes at step 55 by stepping through transmitter de-emphasis preset settings of the BERT 22 and receiver CTLE settings of the oscilloscope 32 to obtain an optimal transmitter preset and recording the settings of the BERT 22 for use during the testing phase.

The calibration procedures for the receiver equalization testing are now completed and a stressed eye signal is created at the receiver end. The final settings of the BERT 22 can be used for the BER testing.

Figure 6:
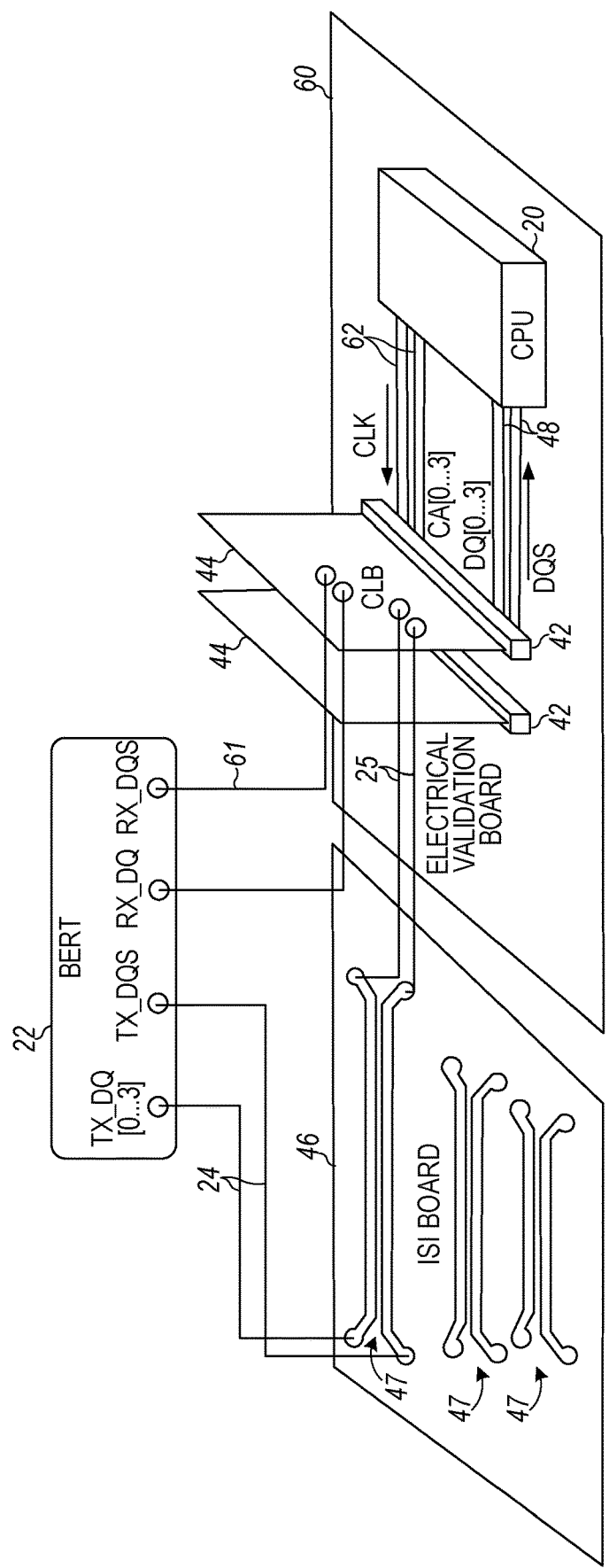
FIG. 6 illustrates a perspective view of a receiver equalization testing arrangement set up for BER testing of the DDR5 system board and memory controller receiver in a sample embodiment.

FIG. 6 illustrates a measurement setup for the DDR5 system board and memory controller receiver for BER testing in a sample embodiment. As illustrated, the CLB 44 is now inserted into an electrical validation board (EVB) 60 of the CPU 20. The transmit TX_DQ and TX_DQS signals from the BERT 22 are transmitted to the EVB 60 through the ISI board 46, SMA cables 24 and 25, and CLB 44. The signals will go through the package traces of the CPU 20, amplified by the differential receivers of the DDR physical layer, passed through the receiver equalization units of CTLE and DFB, and recovered at the receive latches of the memory controller of the CPU 20. Among the four data signals DQ[0 . . . 3] in a sample configuration, three of them will be assigned as the aggressors to generate crosstalk noise, and the remaining one will be designated as the victim. Therefore, stressed eye waveform of the victim signal will include the crosstalk noise from the aggressor signals.

Figure 7:
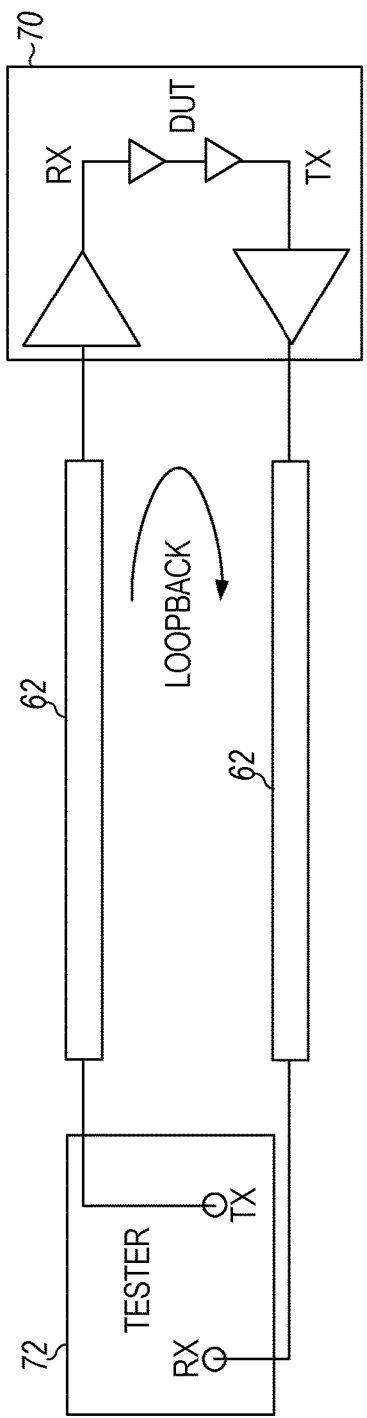
FIG. 7 illustrates a loopback test arrangement for a device under test (DUT) in a sample embodiment.

A new feature introduced for the DDR5 memory controller receiver equalization testing herein is that the received signals will be looped back and transmitted over the existing CA and Clock bus 62 and back to BERT 22 via SMA cable 61, as shown in FIG. 6 and more particularly in FIG. 7. A loopback feature is a function for a device under test (DUT) 70 to receive the input data from an external tester 72 or an internal unit, pass it through its internal paths and gates, and transmit the identical data from its transmitter port back to the tester or the internal unit. The tester 72 or the internal unit will have the capability to compare the transmitted data back from the DUT 70 to the original data it sends to the DUT 70, and calculate the error rate. The goal of the loopback test is to validate that the receiver and transmitter of the DUT 70 can work appropriately and are able to loopback the data correctly and in a timely fashion.

FIG. 7 illustrates the loopback test with an external tester 72 for DUT 70.

Figure 8:
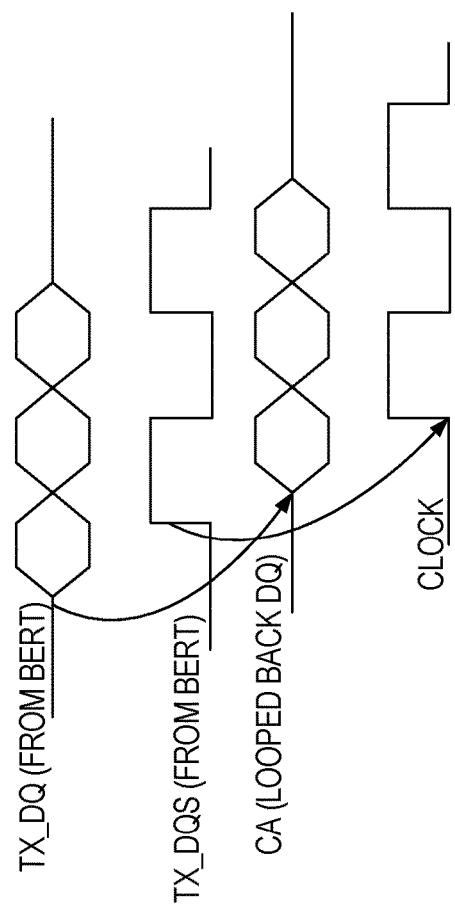
FIG. 8 illustrates the looped back command and address (CA) and Clock signals transmitted through the CA bus to the receive channels of the BER tester in a sample embodiment.

The loopback scheme of FIG. 7 has the advantage of saving additional LB_DQ and LB_DQS pins as described in U.S. Provisional Patent Application No. 62/633,421. The looped back CA signals are identically duplicated and delayed from the input data signal stream received at the aforementioned victim DQ lane. The looped back CA and Clock signals are transmitted through the CA and Clock bus 62 to the receive channels of the BERT 22 via SMA cable 61. Alternatively, the looped back signals may be sent via Command, Control, Data, Response, and other output pins from the CPU 20. As illustrated in FIG. 8, the transmitted TX_DQ and TX_DQS signals from the BERT 22 are looped back as RX_DQ on the CA bus 62 along with the clock signal (Clock). The BERT 22 will then compare the received RX_DQ signal to the transmitted TX_DQ signal, and calculate the bit error rate. To conduct this testing, the new loopback path is supported by the memory controller and DDR physical layer implementations of the CPU 20.

With loopback, a DDR5 device can feed a received signal or data back out to an external receiver for multiple purposes. Loopback allows the host (memory controller or test instrument) to immediately read back data that was just sent to the DRAM without having to issue multiple WRITE/READ commands. Loopback in a DDR5 DRAM requires that the data be sent to the loopback path before sending it to the core so no READ/WRTE commands are required for loopback to be operational. There are also inherent limitations when characterizing the receiver using statistical analysis methods such as Bit Error Rate (BER) analysis. For example, at BER=$1E^{-16}$ there is not enough memory depth in the DRAM to store all the data. Also, the amount of time to perform multiple WRITE/READ commands to/from the memory is prohibitively long. Since the amount of time involved performing these operations is much longer than the DRAM refresh rate interval, the host or memory controller also manages refreshes during testing to ensure data retention. In addition, limited pattern depth means limited Inter Symbol Interference (ISI) and limited Random Jitter (Rj), and, therefore, limited errors at the receiver. Use of the loopback feature is thus desirable for characterizing the receiver without the limitations and complexities of other traditional validation methods. Loopback can also be used during "normal" operation, i.e., during training and when an operating system is loaded.

The BER testing procedure can be summarized into the following steps:

1. Configure the BERT 22 with the jitter, noise and timing settings that derive the worst-case RX stressed eye in the calibration step, in which the RX stressed eye diagram should meet and most closely match the stressed eye mask specification of the design target.

2. Connect the SMA cables 24 from the BERT 22 to the ISI channel 47 on the ISI board 46 that corresponds to the selected replica channel in the calibration step and from the ISI board 46 to the CLB 44 using SMA cables 61.

3. Have the BERT 22 run the equalization protocol, and train the DDR5 memory controller receiver to obtain the optimal CTLE and/or DFE tap settings for the given channel. As known to those skilled in the art, the "equalization protocol" involves stepping through the transmitter preset settings and the receiver CTLE and DFE settings to obtain the optimal receiver/transmitter equalization combinations for the given channel.

4. Have the BERT 22 put the CPU 20 into loopback mode, so that the looped back data is transmitted on the CA bus 62 back to the CLB 44. Optionally, the looped back signals may be transmitted through other existing ports or dedicated pins of LB_DQ and LB_DQS of the CPU 20, if available.

5. Have the BERT 22 transmit the DDR5 data pattern as described in the JEDEC DDR5 specification into the CPU 20 and verify the detected bit error rate is within the design specification. For example, at the speed of DDR5-3200 with a requirement of BER<$10^{-12}$, this implies a continuous transmission of data through a duration of approximately 5 minutes. If there is one or less error detected by the BERT 22 in 5 minutes, the CPU 20 is considered as having passed the BER testing.

Figure 9:
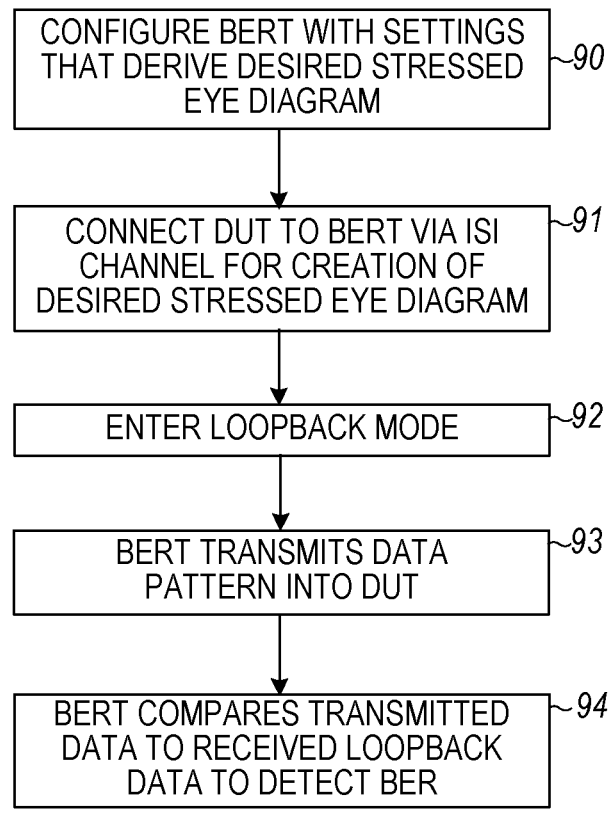
FIG. 9 illustrates the testing method of a sample embodiment.

FIG. 9 illustrates the testing method of a sample embodiment. As illustrated, the testing method includes configuring the BERT 22 with the DDR5 data pattern with injected noise and jitter that derives a desired receiver stressed eye diagram at step 90. In a sample embodiment, configuring the BERT 22 includes running an equalization protocol to train the DUT 70 to obtain one or more of an optimal DFE tap setting and an optimal CTLE tap setting for the ISI channel. The DUT 70 is then connected to the BERT 22 via an ISI channel that introduces delays for creation of the desired receiver stressed eye diagram at step 91. The BERT 22 then places the DUT 70 into a loopback mode whereby data transmitted to the DUT 70 by the BERT 22 is transmitted back to the BERT 22 for comparison to the data transmitted to DUT 70 at 92. At step 93, the BERT 22 transmits a data pattern into the DUT 70, and the BERT 22 then compares the data transmitted to DUT 70 to data received back from the DUT 70 during the loopback mode to detect the bit error rate at step 94.

Figure 10:
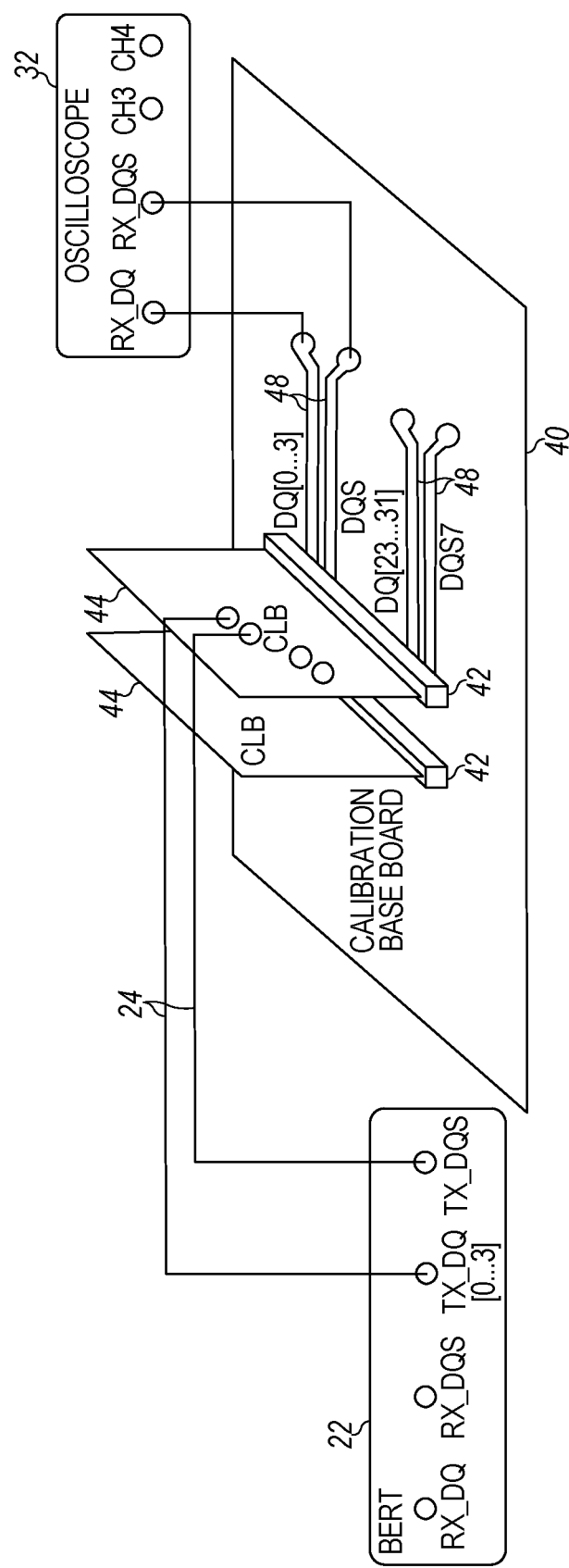
FIG. 10 illustrates a perspective view of another embodiment of a receiver equalization testing arrangement set up for calibrating a DDR5 system board and memory controller receiver without the inter-symbol interference (ISI) board of the embodiment of FIG. 4.
Figure 11:
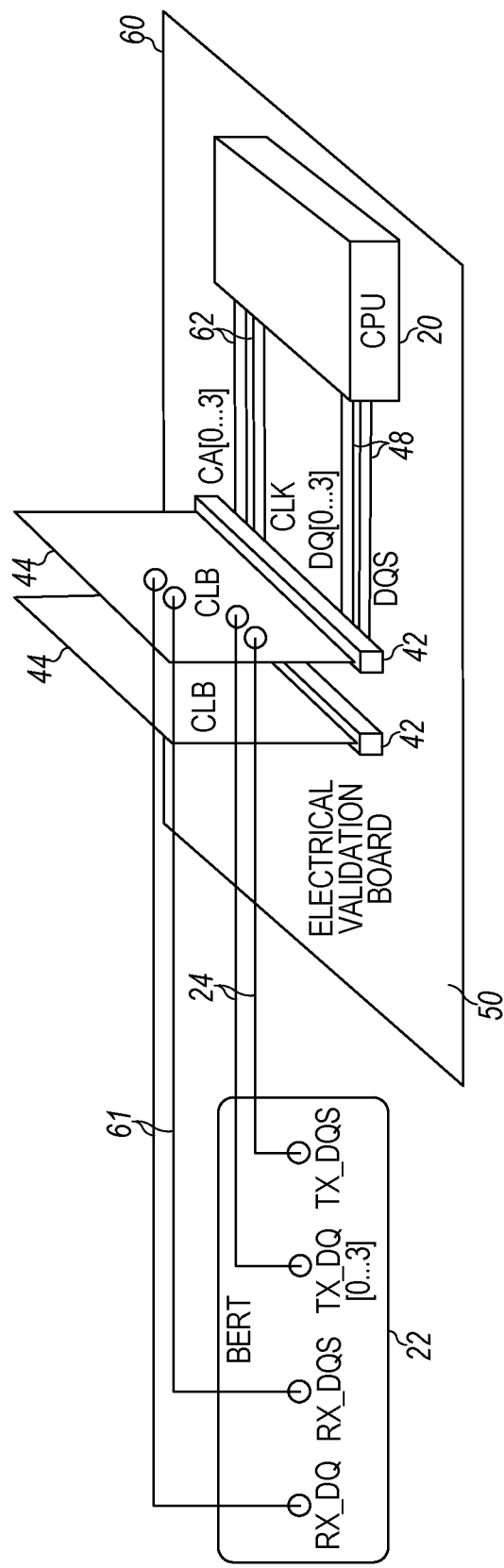
FIG. 11 illustrates a perspective view of another embodiment of a receiver equalization testing arrangement set up for BER testing of a DDR5 system board and memory controller receiver without the ISI board of the embodiment of FIG. 6.

FIG. 10 (receiver equalization calibration setup) and FIG. 11 (receiver equalization BER testing setup) demonstrate an alternative system implementation scheme to conduct the DDR5 system board and memory controller receiver equalization testing, which performs the calibration and BER testing steps without the ISI board 46. In this case, the ISI board 46 is removed and the TX_DQ and TX_DQS jitter/noise signals from the BERT 22 are directly fed into the CLB 44 as illustrated. The various trace lengths are instead implemented in the CBB 40 and EVB 60 by varying the length of the DQ bus 48. It will be appreciated by those skilled in the art that a wide range of trace lengths of DQ bus 48 are needed on the CBB 40 and EVB 60 to provide the means for providing different delay and inter-symbol interference (ISI) effects for imposing necessary insertion loss and attenuation to the DDR5 signals. Thus, this requirement may be found overly stringent in some applications where the EVB 60 is required to closely match the real product board and customer reference board.

Those skilled in the art will appreciate that the systems and methods described herein provide a detailed electrical testing setup and procedures to conduct receiver link equalization testing for the DDR5 system board and memory controller. A loopback function is further provided that transmits the received signals back through existing CA and Clock buses (or alternatively via Command, Control, Data, Response, and other output pins), thereby saving pins otherwise required for LB_DQ and LB_DQS signals. The testing system also uses standard testing equipment and fixtures for the BERT 22, ISI board 46, CBB 40, and CLB 44 to help calibrate and generate the worst-case stressed eye signals without requiring unique or proprietary layouts for different devices under test or during calibration. The DDR5 receiver equalization testing is instead performed for any CPU EVB 60 without the need for additional hardware. The CBB 40, CLB 44, and ISI boards 46 are standard fixtures and can be reused for multiple projects.

Those skilled in the art will appreciate that the system described herein provides many technical advantages over conventional systems. For example, there is no existing testing method in the current DDR4 memory system that can conduct receiver equalization and BER testing, which is becoming the new standard of electrical and compliance testing for the upcoming DDR5 DRAM. The systems and methods described herein define a testing system solution and methodology that supports the receiver equalization and BER testing for a DDR5 system board and memory controller. Also, compared to previous solutions, the systems and methods described herein eliminate the need for a dedicated base board with a replica channel and utilizes a set of standard testing fixtures that can be reused across multiple platforms and products, significantly reducing costs. Also, an inter-symbol interference board with various trace lengths is introduced to provide a wide range of insertion loss and signal attenuation to help facilitate the creation of worst-case stressed eye signals at the receiver end. An alternative system and method are described for implementing the various trace lengths on the base boards. Finally, a loopback path is introduced that sends out the received data signals and transmits the looped back signals through the existing CA and Clock buses (or alternatively via Command, Control, Data, Response, and other output pins), which saves the cost of adding additional LB_DQ and LB_DQS pins to the CPU.

While several embodiments have been provided in the present disclosure, it should be understood that the disclosed systems and methods might be embodied in many other specific forms without departing from the scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A system for conducting receiver link equalization and bit error rate (BER) testing for an electronic device under test using a bit error rate tester (BERT), the system comprising:
   an electrical validation board having one or more pairs of data traces that connect to the electronic device under test; and
   a calibration load board that connects to the one or more pairs of data traces of the electrical validation board to receive a data pattern with jitter and noise injected from the BERT for transmission to the electronic device under test and that transmits the data pattern back to the BERT for calculation of a bit error rate.

2. The system of claim 1, wherein the one or more pairs of data traces comprises two or more pairs of data traces where each pair of data traces has a different length to cause different delay and inter-symbol interference effects when a data pattern is provided to the electronic device under test via one of the pairs of data traces.

3. The system of claim 1, wherein the electrical validation board includes a clock bus and a command and address (CA) bus, and wherein a loopback function is provided by connecting an output of the electronic device under test to the clock bus and the CA bus of the electrical validation board, whereby the data pattern received by the electronic device under test is sent back through CA and clock ports of the electronic device under test and transmitted through the CA and clock buses of the electrical validation board and compliance load board back to the BERT.

4. The system of claim 1, wherein the electrical validation board includes one or more of Command, Control, Data, Response, and other output buses, and wherein a loopback function is provided by connecting an output of the electronic device under test to one or more of the Command, Control, Data, Response, and other output buses of the electrical validation board, whereby the data pattern received by the electronic device under test is sent back through one or more of Command, Control, Data, Response, and other output ports of the electronic device under test and transmitted through one or more of the Command, Control, Data, Response, and other output buses of the electrical validation board and compliance load board back to the BERT.

5. The system of claim 1, wherein the one or more pairs of data traces of the electrical validation board are of equal length, further comprising an inter-symbol interference board disposed between the BERT and the calibration load board so as to receive the data pattern from the BERT, the inter-symbol interference board having respective pairs of data traces of varied lengths to provide the different delay and inter-symbol interference effects to the electronic device under test via the calibration load board.

6. The system of claim 5, wherein a loopback function is provided by outputting the received data pattern through signal ports of the electronic device under test and transmitting the outputted signals back to the BERT through the buses of the electrical validation board, the compliance load board and the inter-symbol interference board.

7. The system of claim 1, wherein the data pattern provided to the electronic device under test causes the generation of stressed eye signals at the electronic device under test.

8. The system of claim 1, further comprising an oscilloscope connected to the one or more pairs of data traces of the electrical validation board to display a stressed eye signal received from the BERT.

9. The system of claim 8, wherein the one or more pairs of data traces of the electrical validation board have varied lengths to provide different delay and inter-symbol interference effects for display by the oscilloscope.

10. The system of claim 8, wherein the one or more pairs of data traces of the electrical validation board are of equal length, further comprising an inter-symbol interference board disposed between the BERT and the calibration load board which receives the data pattern from the BERT, the inter-symbol interference board having data traces of varied lengths to provide the different delay and inter-symbol interference effects to the oscilloscope via the calibration load board and the electrical validation board.

11. The system of claim 8, wherein the data pattern provided to the electronic device under test causes the generation of the stressed eye signal for display on the oscilloscope.

12. The system of claim 8, wherein the oscilloscope steps through receiver continuous time linear equalization settings to obtain an optimal transmitter preset.

13. The system of claim 8, wherein an input of the oscilloscope is directly connected to a transmit channel of the BERT so as to receive random jitter and sinusoidal jitter levels of transmit signals from the BERT set to nominal values described in prescribed design specifications for the electronic device under test.

14. A method of conducting hit error rate testing of an electronic device under test using a bit error rate tester (BERT), comprising:
    configuring the BERT with one or more of jitter, noise, and timing settings to derive a desired receiver stressed eye diagram;
    connecting the electronic device under test to the BERT via an inter-symbol interference channel that introduces delays for creation of the desired receiver stressed eye diagram at the electronic device under test;
    the BERT placing the electronic device under test into a loopback mode whereby data transmitted to the electronic device under test by the BERT is transmitted back to the BERT for comparison to the data transmitted to the electronic device under test;
    the BERT transmitting a data pattern into the electronic device under test; and
    the BERT comparing the data pattern transmitted to the electronic device under test by the BERT to data received back from the electronic device under test during the loopback mode to detect a bit error rate.

15. The method of claim 14, wherein configuring the BERT comprises configuring the BERT to run an equalization protocol to train the electronic device under test to obtain one or more of an optimal decision feedback equalization tap setting and an optimal continuous time linear equalization tap setting for the inter-symbol interference channel.

16. The method of claim 14, further including selecting a data trace from a number of data traces of an electrical validation board into which the electronic device under test is connected for testing, the data traces having different lengths, the selected data trace forming part of the inter-symbol interference channel to introduce a desired delay for creation of the desired receiver stressed eye diagram at the electronic device under test.

17. The method of claim 16, wherein the loopback mode comprises transmitting the data pattern to the electronic device under test from the BERT via the selected data trace of the electrical validation board and the electronic device under test transmitting the received data pattern back to the BERT via the selected data trace of the electrical validation board.

18. The method of claim 14, further including selecting a data trace from a number of data traces of an inter-symbol interference board disposed between the BERT and the electronic device under test, the data traces having different lengths, the selected data trace forming part of the inter-symbol interference channel to introduce a desired delay for creation of the desired receiver stressed eye diagram at the electronic device under test.

19. The method of claim 18, wherein the loopback mode comprises transmitting the data pattern to the electronic device under test from the BERT via the selected data trace of the inter-symbol interference board and the electronic device under test transmitting the received data pattern back to the BERT via the selected data trace of the inter-symbol interference board.

20. The method of claim 14, wherein the data pattern provided to the electronic device under test by the BERT causes the generation of stressed eye signals at the electronic device under test.

* * * * *